(12) United States Patent
Lai et al.

(10) Patent No.: US 7,928,746 B1
(45) Date of Patent: Apr. 19, 2011

(54) EXCLUSIVE-OPTION CHIPS AND METHODS WITH ALL-OPTIONS-ACTIVE TEST MODE

(75) Inventors: Po-Shen Lai, San Jose, CA (US); Paul A. Lassa, Mountain View, CA (US); Paul C. Paternoster, Los Altos, CA (US)

(73) Assignee: SanDisk Corporation, Milpitas, CA (US)

( * ) Notice: Subject to any disclaimer, the term of this patent is extended or adjusted under 35 U.S.C. 154(b) by 599 days.

(21) Appl. No.: 11/966,147

(22) Filed: Dec. 28, 2007

(51) Int. Cl.
 *G01R 31/3187* (2006.01)
(52) U.S. Cl. ............ 324/750.3; 324/762.01; 324/762.02
(58) Field of Classification Search ........................ None
 See application file for complete search history.

(56) References Cited

U.S. PATENT DOCUMENTS

| | | | | |
|---|---|---|---|---|
| 5,627,842 A | * | 5/1997 | Brown et al. | 714/727 |
| 6,060,897 A | * | 5/2000 | Shacham et al. | 324/762.02 |
| 6,519,171 B2 | * | 2/2003 | Matsuzaki et al. | 365/51 |
| 2005/0289251 A1 | * | 12/2005 | Lee et al. | 710/14 |
| 2010/0229038 A1 | * | 9/2010 | Mayer et al. | 714/27 |

* cited by examiner

*Primary Examiner* — Paresh Patel
(74) *Attorney, Agent, or Firm* — Brinks Hofer Gilson & Lione

(57) ABSTRACT

A multi-interface integrated circuit in which, during the chip's lifetime in use, only one interface is active at a time. However, special test logic powers up all of the on-chip interface modules at once, so that a complete test cycle can be performed. All of the interfaces are exercised in one test program. Since some pads are inactive in some interface modes, mask bits are used to select which pads are monitored during which test cycles.

11 Claims, 11 Drawing Sheets

| 15 | 14 | 13 | 12 | 11 | 10 | 9 | 8 |
|---|---|---|---|---|---|---|---|
| Disable Reset | | Test Modes | | | | Disable Test Modes | Reserved |

| 7 | 6 | 5 | 4 | 3 | 2 | 1 | 0 |
|---|---|---|---|---|---|---|---|
| Non-Probing Pads Scheme | Real Time Trace | Output External/Internal Clocks | External FE CLK | External FIM CLK Through Dividing Logic | External FIM CLK Bypass Dividing Logic | External SYS CLK Through Dividing Logic | External SYS CLK Bypass Dividing Logic |

FIG. 5

EXCLUSIVE-OPTION CHIPS AND METHODS WITH ALL-OPTIONS-ACTIVE TEST MODE

BACKGROUND

The present application relates to integrated circuits which can be configured into several very different functions after wafer fabrication, and more particularly to test mode control in such integrated circuits of this type.

As the constraints of low-power integrated circuits have steadily become tighter, the technique of power islands has become more important. In this technology some portions of an integrated circuit are powered up only on an "as-needed" basis. These individual sections are referred to as "power islands."

In other applications (which are not admitted to be prior art to the present application), SanDisk inventors have described the technique of static or quasi-static power island selection to configure a control chip for any one of several external interface modes. For example, a memory control circuit which can be locally connected to a nonvolatile memory, and can also be configured to provide an external interface to USB, SD, or MS electrical standards.

SUMMARY

The present application discloses new approaches to use of power islands. A low-power chip which includes power islands is capable, at the time of manufacturing, of operating in one of several mutually exclusive modes. Selection of which mode the chip will use in the field is done by quasi-static selection of a power island, so that the circuitry which would be needed for the deselected mode is permanently powered off. (However, other power islands on the chip can preferably be powered up or down temporarily, as is conventional.) This static selection is typically a result of the voltages seen at the bond pads when the chip is powered up. Thus operation of the statically-selected power islands is normally mutually exclusive, since only one mode can operate at a time, and the statically-selected islands could conflict in shared peripheral circuits or connections. (Indeed, there is preferably no way for connections to the packaged chip to enable conflicting modes simultaneously.) The present application teaches an important exception: multiple ones of the statically-selected islands are powered up simultaneously for test mode, e.g. at the time of manufacturing. Thus the multi-mode chips can be fully tested without undue delays, while still obtaining the advantages of statically selectable mode.

The disclosed innovations, in various embodiments, provide one or more of at least the following advantages:
  Reduced power consumption;
  The mask cost of manufacturing an entire family of products is reduced, since only one mask set is used.
  Thorough testing and resulting high reliability
  Multi-interface capability is preserved through testing, so that an inventory of fully qualified dice can be kept on-hand for packaging into one or more options.
  Simpler testing and back-end logistics.
  Higher net throughput at testing, resulting in faster testing.
  Only one test program is required.
  Supply chain management can be optimized, since a product which is more in demand can easily get more die allocation from products with less demand, since they all share the same die.
  Simplified queuing in the backend processing.
  Accelerated time to market.

BRIEF DESCRIPTION OF THE DRAWINGS

The disclosed inventions will be described with reference to the accompanying drawings, which show important sample embodiments of the invention and which are incorporated in the specification hereof by reference, wherein:

FIGS. 1B-1, 1B-2 and 1B-3 together show a power island diagram of the integrated circuit of FIG. 1A;

FIG. 2 shows further details of the implementation of the circuit of FIG. 1 in a power island architecture;

FIG. 3 shows external clock selection when entering test mode;

FIG. 5 illustrates a Test Mode Register.

DETAILED DESCRIPTION OF THE PREFERRED EMBODIMENTS

The numerous innovative teachings of the present application will be described with particular reference to presently preferred embodiments (by way of example, and not of limitation).

The various claimed inventions will be illustrated by an example of an integrated circuit in which potential modes of operation can be permanently deselected, by setting an on-chip stored value which keeps the unneeded circuitry powered off. However, it should be noted that many modifications and variations are possible, and just a few of these are listed in the Modifications and Variations section below.

One of the general teachings set forth in the present application is that a multifunction integrated circuit, which is precluded from activating both first and second power islands simultaneously during any part of its operation, is allowed to activate both first and second power islands simultaneously during testing.

Another general teaching is that, in some classes of embodiments, power management logic, which normally forces all but one of a set of alternative mode implementation circuits to remain powered off, only allows more than one of these alternative mode implementation circuits to be powered up during a test mode which is not available during product mode (i.e. normal) operation.

Sample Integrated Circuit

Figure 1:
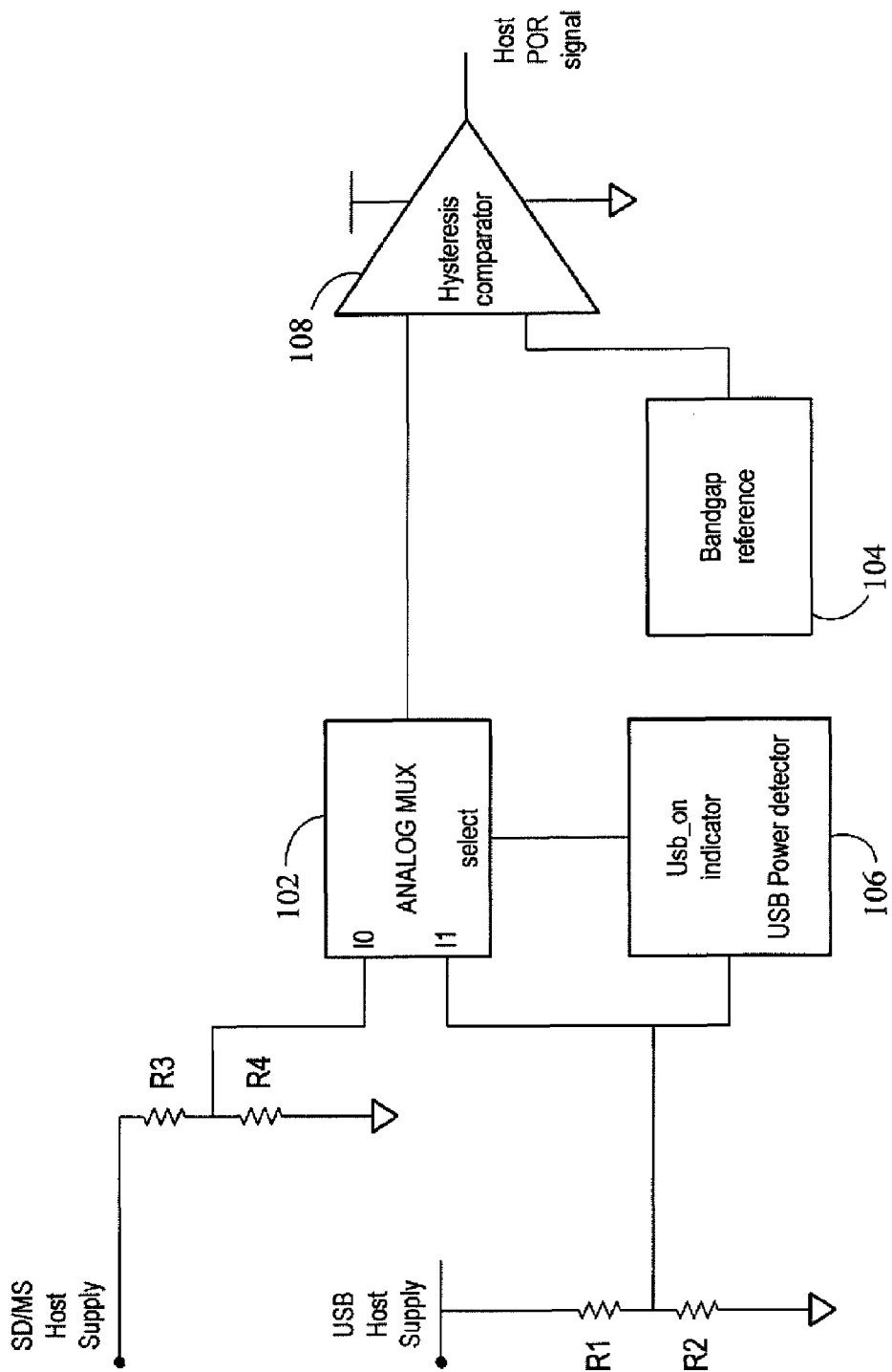
FIG. 1 schematically shows an automatically switched power-on reset circuit.
Figure 1A:
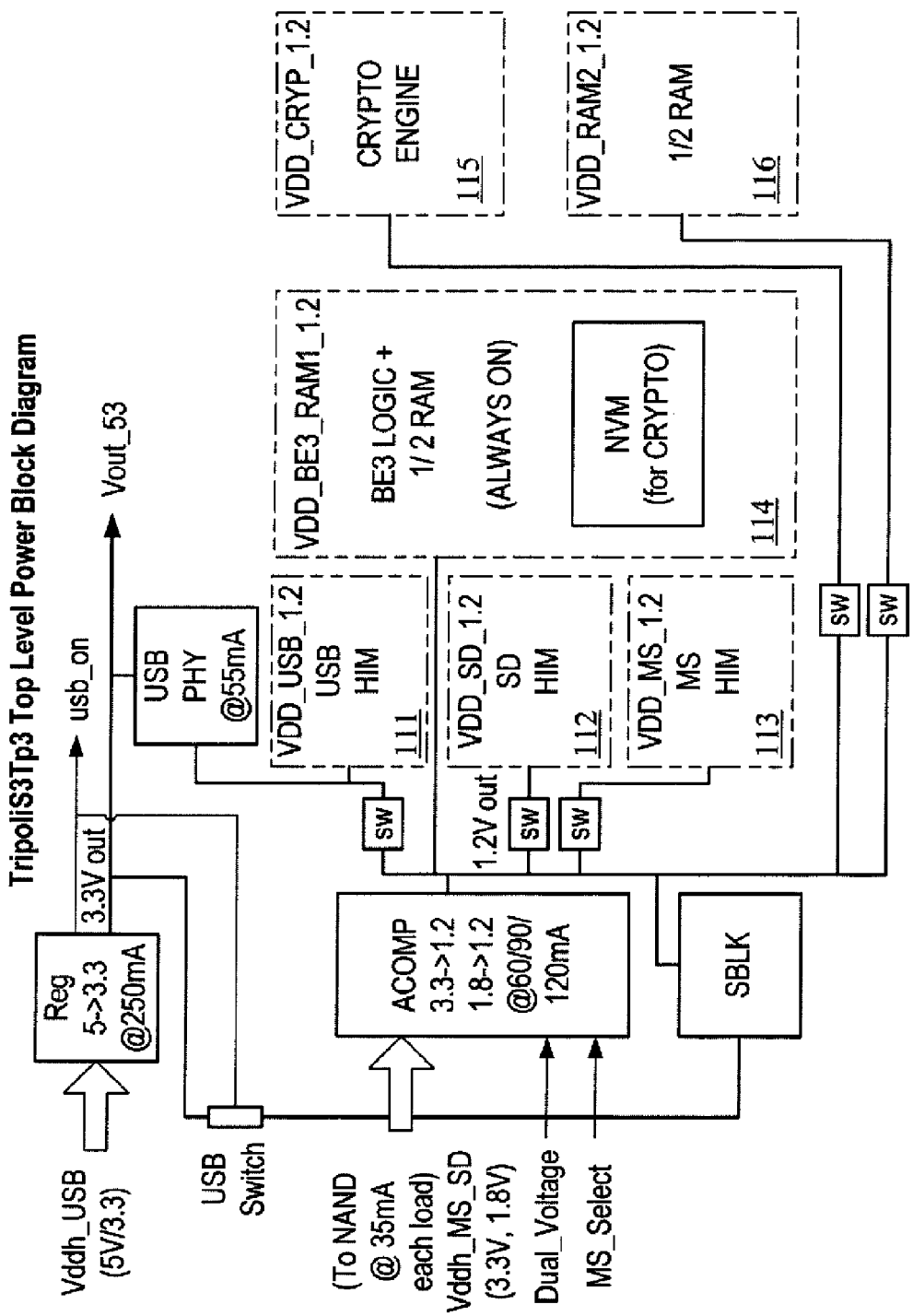
FIG. 1A shows a block diagram of an integrated circuit which advantageously includes the circuit of FIG. 1.
Figures 1, 1B:
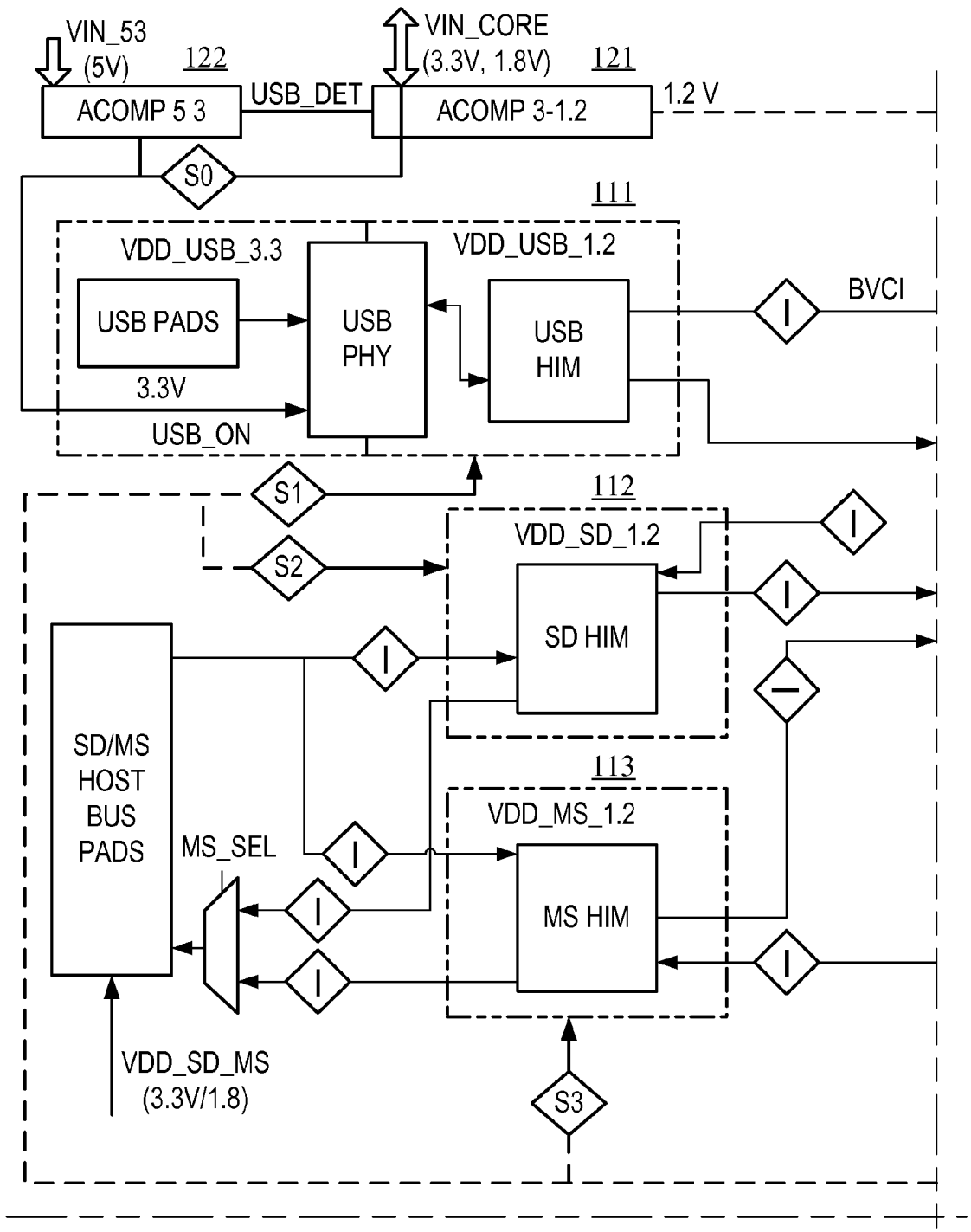
Figures 1, 1B, 2:
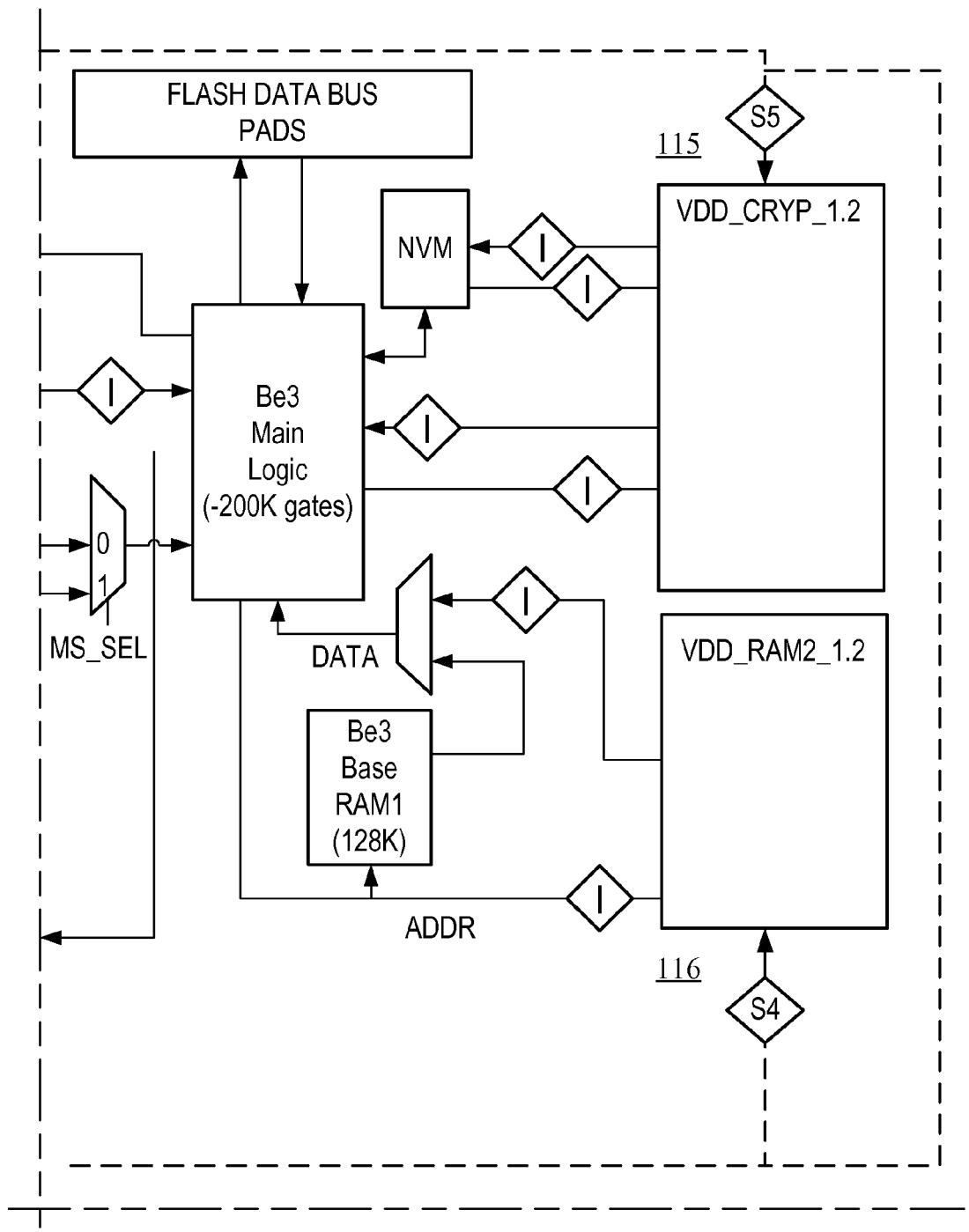

FIG. 1A shows a diagram of an integrated circuit which advantageously includes the circuit of FIG. 1, and FIGS. 1B-1, 1B-2 and 1B-3 together show a power island diagram of the integrated circuit of FIG. 1A.

The sample embodiment of FIG. 1A is a multifunction flash memory controller referred to as Tripoli, which is capable of three different external interfaces. Notable features of this embodiment (which are not necessary to the claimed inventions) include:

Tripoli implements a Secure Flash memory controller Back-End with provisions for data transfer over three Host interfaces (SD/MMC, USB, MS), though only one host I/F is used at a time.

Triple-Overhead Him Drive (TOHD) technology provides Top-level logic to detect and configure a single Host interface to the Back-end, and to power down the remaining 2 Host interface voltage islands. Detection result register is available to FIRMWARE boot ROM Design is partitioned into 6 voltage islands (SD/MMC HIM, USB HIM, MS HIM, Always ON (Back End, MRAM, Pad control, and Power Management), ORAM, and Crypto Engine)

There is no power consumption overhead, standby or active, from the logic in two powered-down Host interfaces. OFF Islands will be isolated from VCC and GND, and no current will flow Partial-chip Power-down functionality will be achieved with controlled analog power switches for each island (except Always ON), and isolation gates will be used to prevent invalid signals from powered-down islands from reaching inputs of the powered-on islands Provides dynamic island control to power-down ORAM and Crypto Engine modules during standby to achieve spec requirements for standby current (SD/MMC represents minimum spec)

Provides register control of Analog block standby-power reduction features (Regulator and Oscillator standby/disable/low-power).

This sample chip embodiment (known generally as the "Tripoli" chip) is packaged as a SIP, BGA, or QFP, depending on the end product.

Packaging and Test Support

The Tripoli chip provides control logic to configure the pad ring for several product packaging configurations and test modes.

Pad Ring arrangement supports SIP (system-in-Package), 48 BGA for SD/MMC and MS, 80TQFP for USB, and 81VFBGA for SD+products. 176QFP is supported for Controller characterization and qualification Scan test mode supports simultaneous testing of all voltage islands over eight scan chains, as well as sub-set island-based scan for partial support of per-island iddq/leakage (Back End cannot be powered down).

SD/MS/USB test modes/pins sharing

Power Island selection override through FIRMWARE/JTAG for test

Multi-HIM Interface to Back-End

Tripoli offers three Die-level selectable HIM interfaces (Front-ends) connected to a single Back-end.

The BVCI port to the BMU is dedicated to the USB device controller.

The HDMA interfaces of the SD/MMC HIM and the MS HIM must be Muxed into a single HDMA port in the BMU.

Tripoli implements a static HIM configuration at Power-on, and upon de-assertion of POR (Power-on Reset), only one selected HIM shall be permanently configured until the next full power cycle.

Limitation: The SD+product in particular provides an SD interface and a USB interface on each end of the product, but plugging both ends into interfaces at the same time is not supported by the product.

The capability of three product-configurable HIMs on a single die is intended to offer significant supply-chain flexibility.

Tripoli exhibits a "3 capabilities—1-die" design goal to always meet all three sets of requirements.

Power Islands

Unused portions of the logic can be completely powered down such that there is no leakage contribution from those blocks in standby/sleep mode.

Powering-down logic or RAM causes loss of State.

Powering-up after standby is subject to performance requirements—Host response time, code re-loading, etc.

In this sample embodiment, power Island Strategy considerations included: Only one HIM at a time is active in design; and the Crypto module is an independent co-processor engine, which can be powered down with almost no state preservation.

A portion of total RAM can be powered-down. Firmware can place "resume from standby" code in the remaining "Always ON" memory to meet host response time. At pow-erup of this block, Firmware can stream refill the powered-down RAM, which reduces the performance hit.

In this sample embodiment, the Power Island implementation consists of both Static and Dynamic Island control, but no Dynamic Frequency or Voltage scaling.

Island Control Mechanisms

Once the logic and RAM have been logically partitioned into discrete islands, several mechanisms must be added to control the islands and enable standby power savings under the necessary product configurations and conditions:

System Core power gating and control (Host supply regulation and Analog power isolation switches)

Product package detection (e.g., are we in an SD/MMC, USB, or MS product configuration?)

Static Island configuration (enable one HIM, disable other two)

Dynamic Island control and status (CRYPTO, ORAM power-up, power-down sequence timing)=>also provides over-ride of HIM control for Test Logic Gate Isolation Control (ON-Island isolation from OFF-island(s) effects)

Figures 1, 1B, 2, 3:
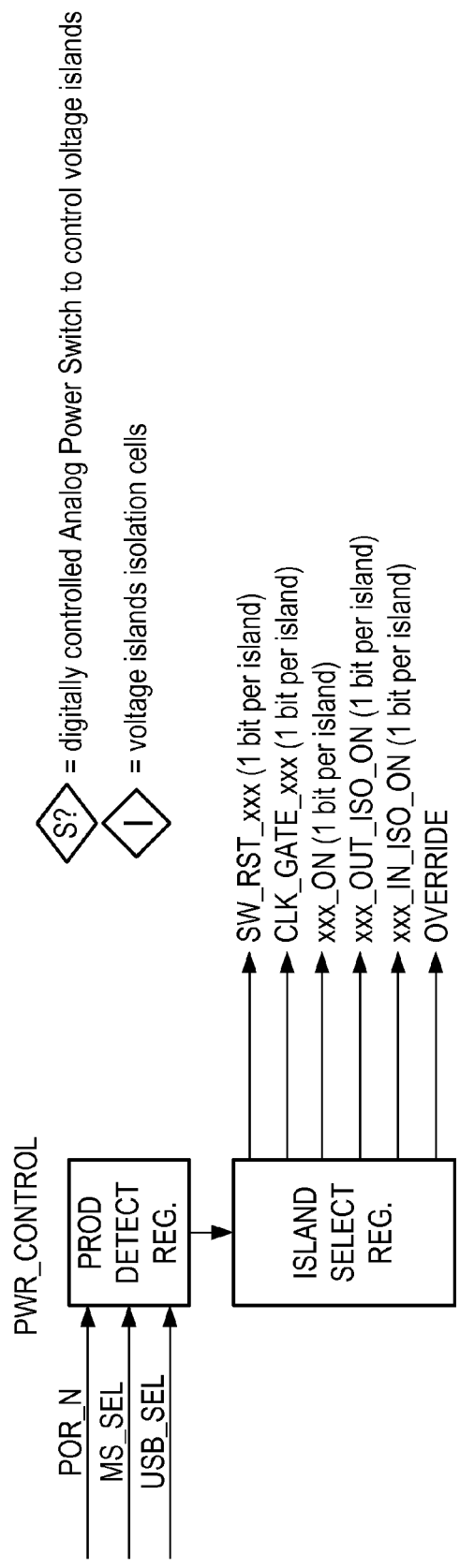
Figure 1C:
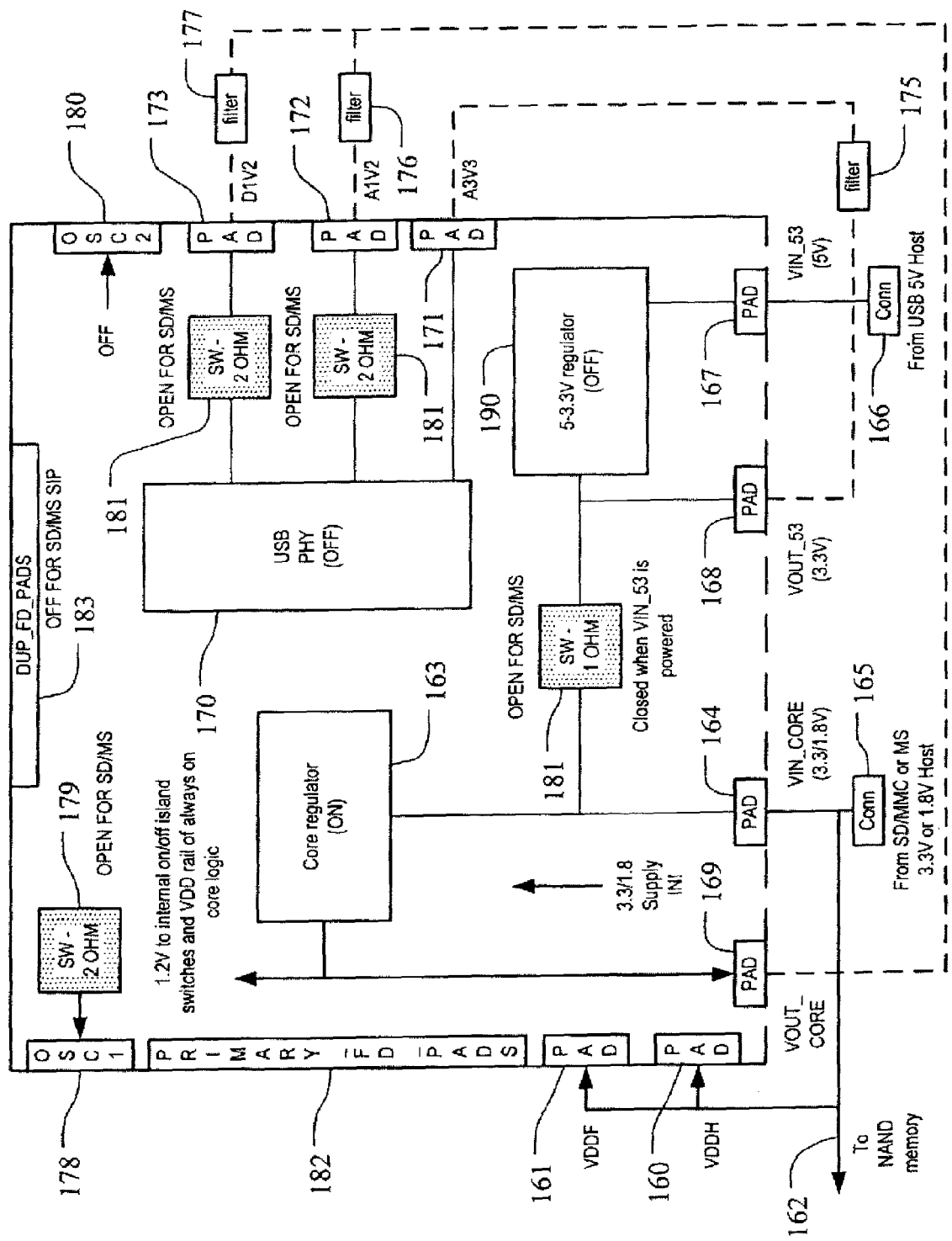
FIG. 1C shows a full bonding diagram of this sample embodiment.

FIG. 1C shows the power status when one of the non-USB HIMs is active. In this case there is Power Reduction. The Host supplies the Core Regulator. The USB oscillator (OSC1) is not needed, and the USB Switch is OPEN. The 5/3V Regulator is OFF. The PHY interface (3.3V) is powered down. The USB PHY Core Switches are OPEN. The Primary FD pads are active, and the FD_DUP pads are not active.

Figure 1D:
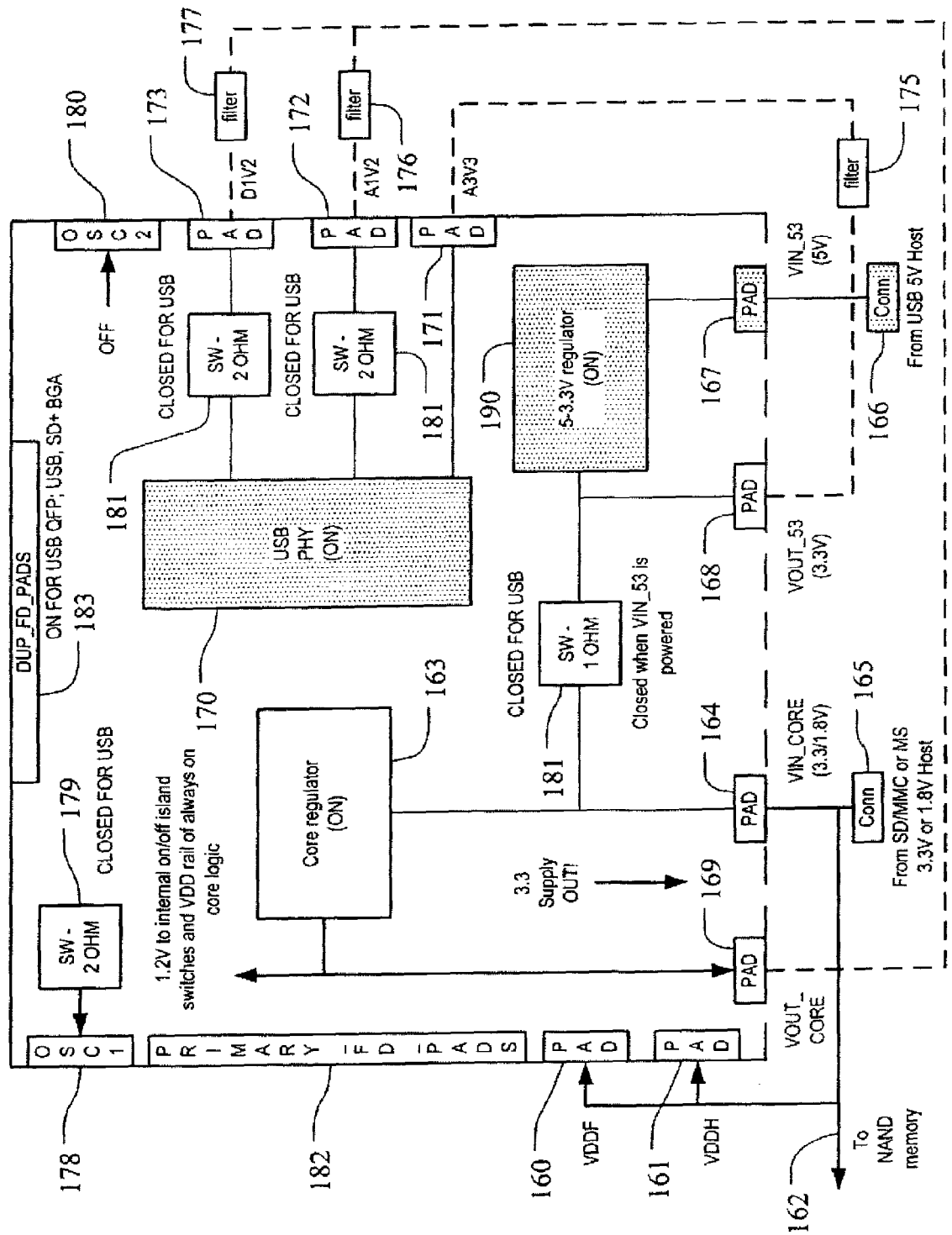
FIG. 1D shows the power status when the USB HIM is active.
Figure 2:
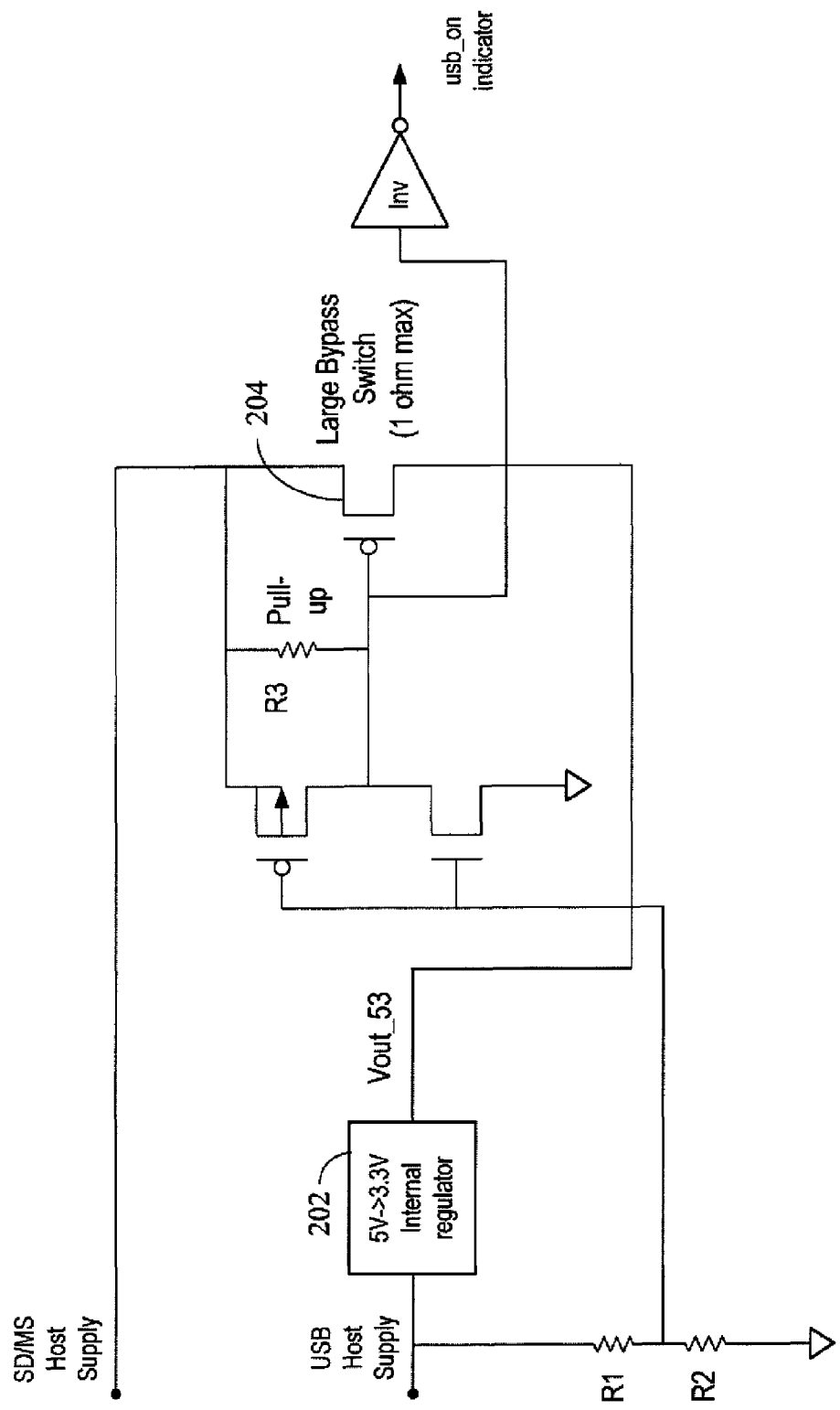
Figure 3:
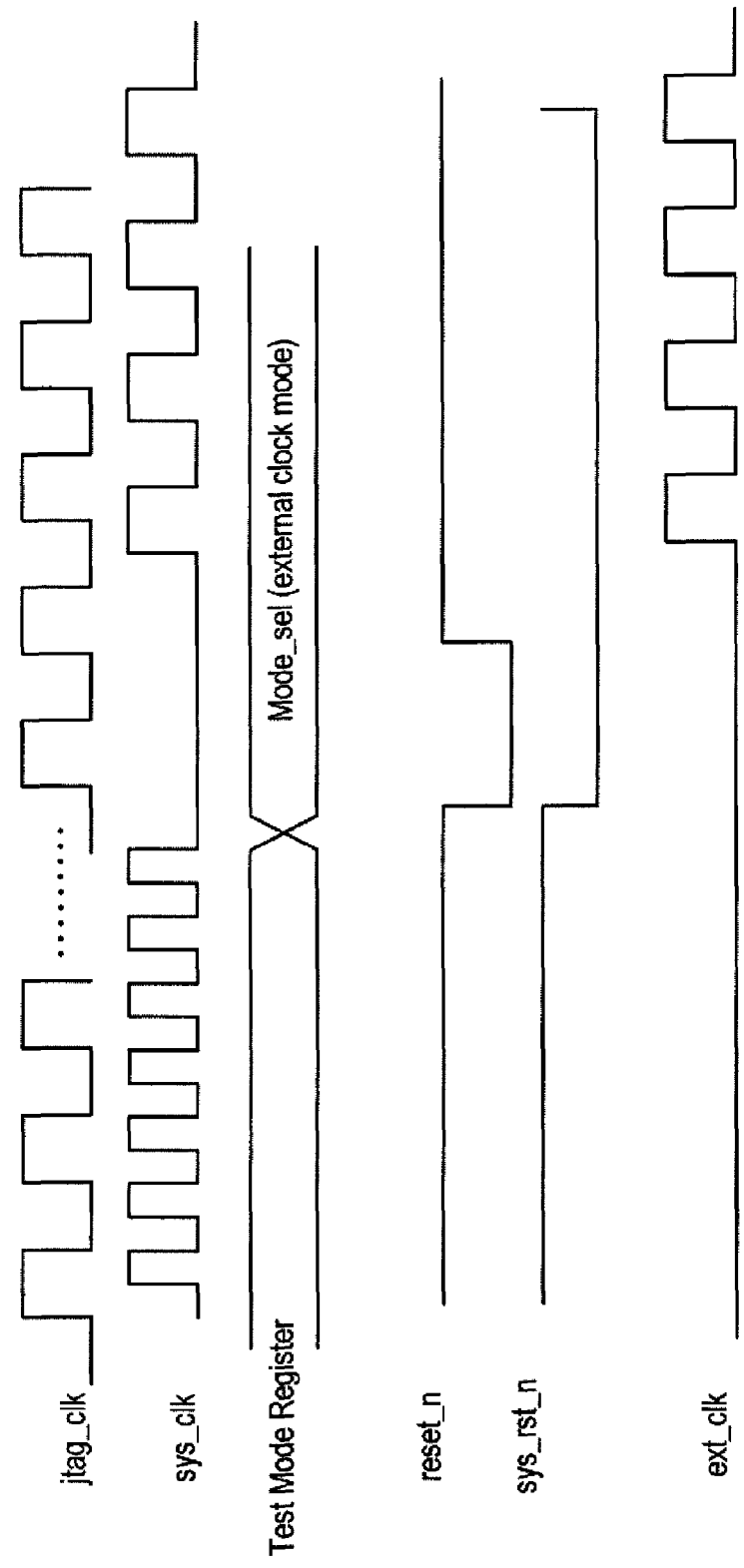

FIG. 1D shows the power status when the USB HIM is active. In this case (USB capable), the 5/3V Regulator is ON, and the USB Switch is CLOSED. The 5/3V regulator supplies the Core Regulator, and the USB oscillator OSC1 is active. The USB physical interface PHY (3.3V) is ON, and the USB PHY Core Switches CLOSED. Some Primary FD pads are OFF, and the duplicate FD_DUP pads are ON.

USB HIM Power Switching

Product Detection is based on power applied to exactly one of the two Voltage regulator inputs (MS/SD_VIN or USB VI5_3)=>USB_SEL, and package bonding (MS_SEL, DUP_SEL), ACOMP logic will determine which single Host Interface (MS, SD/MMC, or USB) is currently selected Power Islands—Island Switching Once the Product Mode is determined, ACOMP logic will enable the appropriate voltage islands for that product. This is mostly a static selection, with two exceptions—standby mode and Scan/test mode Isolation Cells Isolation cells, when switched on, prevent undefined floating logic state from propagating from an un-powered island to the rest of the chip. Isolation cells when enabled will decouple the source and destination points and present either a fixed high voltage (logic 1) or fixed low voltage (logic 0) value or retain the last state on the signal (latch-based). When isolation cells are disabled the cell will just pass the output signal state through between source and destination.

There are two separate isolation cell control registers (island inputs, island outputs).

The isolation cells at the inputs of an island will always be 'logic 0' based cells so that when the island is powered off there is no voltage present at the powered off inputs.

The isolation cells at the outputs of an island are chosen based on benign state such that when the island is shut off the corresponding destination island input will still see benign state.

Firmware Issues from Power Islands

Firmware must manage Crypto block power disable/enable to achieve SD standby mode limits. Firmware must manage code restoration (re-loading) to the ORAM island, which must also be powered down for SD standby mode. Firmware must manage this CRYPTO and ORAM power control within Latency limits for SD Host command response.

Packaging

The multi-chip module (SIP) is most cost-effective for SD/MMC, MS. However, QFP packaging is required for USB. This packaging is low-cost, and allows use of non-captive, packaged NAND supply.

Test Configuration

As noted above, only one of the Host Interface modules can be active, in the preferred embodiment, when the chip is in operation. However, during test mode (only) all of the Host Interface modules are powered up.

The implementation of test mode will now be described. However, it must be understood that there are many possible test functions and many ways to implement them, so the details of the testing function have little relevance to the functional requirements of the claimed inventions.

The controller contains a few special operating modes for ASIC testing and debug.

Entering Test Modes

In the preferred embodiment the chip has several test modes, which can be selected by writing to a CPU register-based Test Mode Register. Writing to this register will assert a system reset to the controller (this reset can be disabled if desired for debug). The Test Mode Register is reset only by POR.

Figure 4:
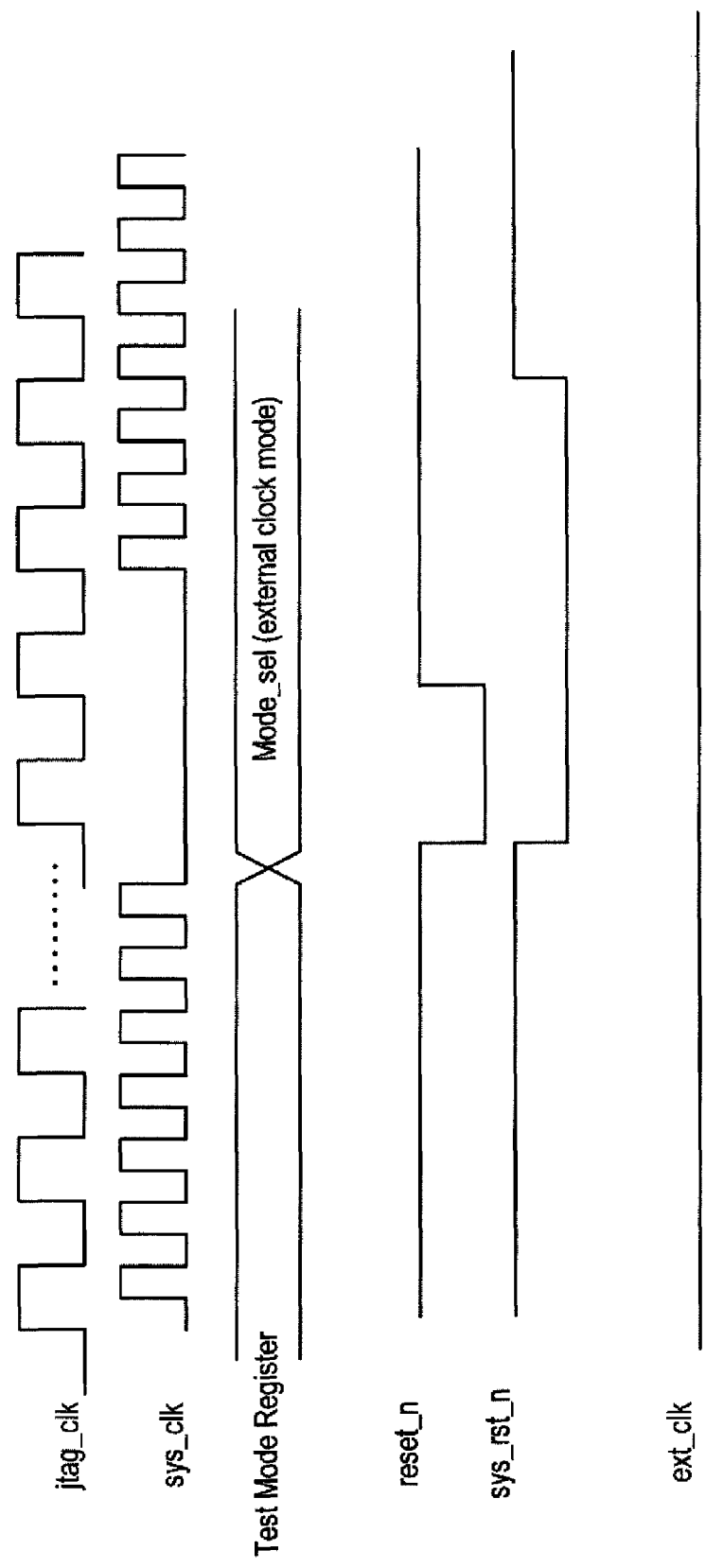
FIG. 4 shows internal clock selection when entering test mode.

The timing is indicated in the FIG. 3 and FIG. 4. FIG. 3 shows the external clock selection when entering test mode. FIG. 4 shows the internal clock selection when entering test mode.

Notes Regarding New Scheme of Entering Test Mode

In the preferred embodiment, when entering test mode:

1. JTAG logic and JTAG pads must be fault-free to enter test modes. JTAG logic should support enough hold time margin to guarantee operation and be fully tested.

In case there is a fault in the JTAG path of setting the Test Mode register, an alternate way to enter test modes is using the SW Unlock WRITE_PORT command through the host, which is supported in ROM.

A test-mode-disable bit (B9) and reset-disable (B15) in the Test Mode Register enables functional testing of the Test Mode Register bits, and its accessing logic, during wafer sort for wafer fault diagnostics.

2. Internal OSC must be functional—JTAG access to set test mode is done using internal clocks.

3. Realtime trace upon POR is not possible. Realtime trace mode will be entered after JTAG-access delay (and then the controller will be reset again).

4. POR will be needed to exit certain test modes when normal access through JTAG to the Test Mode Register is not possible while in these test mode. Some examples are scan, standby test, inpad, outpad. This will require a tester power down cycle (~10 msec).

5. As the TEST signal is removed from BE3, the current reset button on the MUB is obsolete. Other ways of resetting the chip are:

Through the debugger (JTAG) by writing to the test mode register.

Adding logic on the MUB such that the reset button will automatically perform a JTAG write to the test mode register or pulse the host power supply.

Removing the card from the host supply or sending a SW Power Down command.

CF and SD have a host reset signal. If 176-package is used for the MUB, MS can be reset by the flash tristate input.

6. Debugger might need to be exited and re-entered after setting a test mode as controller is reset.

7. Notice that the test modes are entered after JTAG-access delay from POR (although the controller will be reset).

8. In case project specific changes are needed to the pads selections or modes, the changes should be done within the pad control files (with 'ifdef, if needed) so will be incorporated as part of the shared BE3 release.

9. Needed for synthesis: SYS should be set to the slowest clocks, and FIM turned off, before accessing the Test Mode Register.

10. Each test vector running with external clock (that does not require power-down upon completion) should end with returning to normal mode test mode with internal clock and CPU halted. This is needed so the test vector generation in simulation, which starts each vector with internal clock (simulation emulates POR) switching to external clock, will work the same way on the tester, without requesting the tester to power-down between tests (if power-down is not required for that test).

An alternative way is to request the tester to power-down between each test, to put the controller back in internal clock mode.

The Test Mode Register

FIG. 5 shows a Test Mode Register in the preferred embodiment. The Test Mode Register is a read/write register. Its reset state is 0000_0000.

When written, it configures controller test modes.

When read, it returns the configured value to this register, but not directly from this register; rather, it returns a value from a sample register that is a half-cycle delayed from this register.

The read and write values should be identical.

B15 Setting this bit does not assert a controller reset when accessing this register.

Added to enable entering test modes while reserving the previous controller state.

Added so this register and its accessing logic can be verified at wafer sort (by a dedicated functional test vector).

B14:10 Selects the different test modes. See the Test Mode Description Table (follows) for the supported test modes and their recommended configurations with bits 9:0.

B9 Setting this bit disables entering test modes—the value written to bits[14:10] is ignored.

Added so this register, and its accessing logic, can be verified at wafer sort (by a dedicated functional test vector).

B8 Reserved for future.

B7:0 Bit 7:0 are Independent of bit 9 and are still asserted (for example, so that running an external clock during this functional vector is possible).
B7 Indicates the controller supports non-probing pads scheme.
This bit controls the configuration of the non-probed pads in the relevant pad control file.
Note: It should be set to perform parametric tests on the non-probed pads and also needs to be set in certain test modes to enable the correct operation of that test mode.
B6 Enable the real-time trace signals to be reflected on the chip outputs. Used for debug.
Note: For BE3, real-time trace can use only NAND 8-bit data transfers as real-time trace signals are output on the high-order byte of FD.
B5 External or internal (depending on settings of B4:0) SYS, FIM and FE clocks are reflected on chip outputs.
Output of external clocks is needed during characterization to calibrate external and internal clocks.
Internal clocks are output for OSC characterization.
B4 Enable external FE clock (needed for USB PHY testing/UDMA).
B3 FIM clock is supplied externally and goes through the FIM clock dividing logic.
Note: B2 and B3 cannot be set together.
B2 FIM clock is supplied externally and bypasses FIM clock dividing logic.
Note: B2 and B3 cannot be set together.
B1 SYS clock is supplied externally and goes through the SYS clock dividing logic.
Note: B0 and B1 cannot be set together.
B0 SYS clock is supplied externally and bypasses SYS clock dividing logic.
Note: B0 and B1 cannot be set together.
The Test Mode Register is described in details in the following table.

| | | | |
|---|---|---|---|
| 0x00 | Reset Only | Normal operation after reset | All options*<br>Note: for normal operation after reset, Bits[7:0] = 0x00. |
| 0x01 | Scan Mode (High-Power) | Allows access to the internal scan chain for production testing.<br>Keeps the ABLK in high-power mode. | External clocks. FIM and CPU bypassing and going through the dividing logic (for increased coverage). Reset is asserted, although not needed for TMAX =><br>Bit[15] = 0x0.<br>Bits[7:0] = 0x1F (external FE clock).<br>Bits[7:0] = 0x0F (no external FE clock).<br>Note: OSC is turned off during scan, regardless if external clocks are selected.<br>Note: bit[7] Not-Probing Pad Scheme does not need to be set. |
| 0x02 | Leakage Test Mode | Allows leakage current testing for probed pads. | Bits[7:0] = 0x00.<br>Note: bit[7] Not-Probing Pad Scheme does not need to be set. |
| 0x03 | Input Pad Test Mode | Allows input pad functionality and characterization for probed pads. | SYS and FE External clocks, SYS bypass clock diving logic.<br>Bit[7] Not-Probing Pad Scheme must be set if this scheme is supported.<br>=> Bits[7:0] = 0x11 (all pads probed)<br>=> Bits[7:0] = 0x91 (non-probing scheme) |
| 0x04 | Output Pad Test Mode | Allows output pad functionality and characterization for probed pads. | Internal clocks (clocks Reserved).<br>Note: bit[7] Not-Probing Pad Scheme does not need to be set.<br>Bits[7:0] = 0x00. |
| 0x05 | JTAG Test Mode (*) | Keeps CPU halted after reset, until released by the debugger. | All options* |
| 0x06 | Force FW Download | Indication to ROM FW not to proceed with the FW upload from NAND. | All options* |
| 0x07 | UART Test Mode | Allows UART transmit and receive signals to be output/input on external pins. | Internal clocks only. |
| 0x08 | Scan Mode (Low-Power) | Allows access to the internal scan chain for production testing.<br>Keeps the ABLK in low-power mode. | External clocks. FIM and CPU bypassing and going through the dividing logic (for increased coverage). Reset is asserted, although not needed for TMAX. =><br>Bit[15] = 0x0.<br>Bits[7:0] = 0x1F (external FE clock).<br>Bits[7:0] = 0x0F (no external FE clock).<br>Note: OSC is turned off during scan, regardless if external clocks are selected.<br>Note: bit[7] Not-Probing Pad Scheme does not need to be set. |
| 0x0C | PHY Scan Test | Tests PHY scan chains | FE External clock. |
| 0x0D | PHY Bist HS Test | PHY runs HS BIST, FS BIST and CHIRP patterns | |

| | | | |
|---|---|---|---|
| 0x0E | FRONT END Test Mode0 | Used for USB PHY testing | |
| 0x0F | FRONT END Test Mode1 | Used for USB PHY testing | |
| 0x10 | FRONT END Test Mode2 | Used for USB PHY testing | |
| 0x11 | FRONT END Test Mode3 | Used for USB PHY testing | |
| 0x12-0x13 | Reserved for future USB Modes | | |
| 0x14 | NMS Test Mode | | |
| 0x15 | SBLK Test Mode | | External SYS clock |
| 0x16-0x19 | Reserved for future Secure BE Modes | | |
| 0x1A | GPIO1 Test Mode | Added for future. Can be used as needed. | Can be used as needed. |
| 0x1B | GPIO2 Test Mode | Added for future. Can be used as needed. | Can be used as needed. |
| 0x1C-0x1F | Reserved | Future expansions | |

Test Mode Latching

In the preferred embodiment, a reset will be issued to the logic whenever the Test Mode Register is selected and bit [15]=0. The reset will not reset the Test Mode Register.

Setting bit[15] will not assert a controller reset. Setting bit[9] will disable setting test modes (the value in bits[14:10] will be ignored). Bits[7:0] are independent of bit[9] and will still be asserted.

If no special mode code (all zeros) a reset will be issued to the logic, but operation of the controller will proceed normally.

The preferred embodiment provides the following sample operation for more details on how a Secured Tripoli can be accessed through JTAG:

As a Secured BE3 project, the CryptoFlash is blocking by default (each reset) the following interfaces:
 1. JTAG (So entering to HW test mode is blocked), and
 2. IEEE-P1500 (is used to access the NVM from the controller I/F while in "1500 test mode")

So in order to enter in a test mode we need to wait till the CryptoFlash is fetching the "security state" from the NVM. Only if the state is not a secured one (not 4 or 5) can the blocking be removed. Then the CryptoFlash is releasing the blocking of the JTAG. The signal is called "scm_jtag_disable"

After any reset, the CryptoFlash will fetch the state if the CPU will write to the Config_done address. However, the NVM needs a proper Time base clock (Time_B) to perform a read from the EEPROM cells.

So for all the tests that are used for production we are letting the CPU run the ROM code to trigger the sequence. The sequence after reset should be as follows:
 1. Setting the TIMEB_CLK to 1 Mhz.
 2. Asserting the "Confg_done" signal.
 3. The test need to wait (~10 us from 2)—The best is to wait for "scm_jtag_disable"=0(for JTAG and "cry_eprom_test_disable"=0(for IEEE-P 1500).
 Note: If the test is used for production then due to the inaccuracy of the oscillator (Prior to entering to test mode it uses the internal clock!) we need to add 20% waiting time.
 4. The JTAG is available.

Note: Care must be taken for each test mode due to the fact that the test mode value is already set when the reset occurs and the JTAG interface is re-blocked.

Accessing Secured Tripoli through JTAG

As a Secured BE3 project, the CryptoFlash is blocking by default (each reset) the following interfaces:
 1. JTAG (So entering to HW test mode is blocked)
 2. IEEE-P1500 (is used to access the NVM from the controller I/F while "1500_test_mode")

So in order to enter in a test mode we need to wait till the CryptoFlash is fetching the "security state" from the NVM. Only if the state is not a secured one (not 4 or 5) can the blocking be removed. Then, the CryptoFlash is releasing the blocking of the JTAG. The signal is called "scm_jtag_disable"

After any reset, the CryptoFlash will fetch the state if the CPU will write to the Config_done address. However, the NVM needs a proper Time base clock (Time_B) to perform a read from the EEPROM cells.

So for all the tests that are used for production we are letting the CPU run the ROM code to trigger the sequence. The sequence after reset should be as follows:
 1. Setting the TIMEB_CLK to 1 Mhz.
 2. Asserting the "Confg_done" signal.
 3. The test needs to wait (~10 us from 2)—The best is to wait for "scm_jtag_disable"=0 (for JTAG and "cry_eprom_test_disable"=0(for IEEE-P1500).
 Note: If the test is used for production then due to the inaccuracy of the oscillator (Prior to entering to test mode it uses the internal clock) we need to add 20% waiting time.
 4. The JTAG is available.

Note: Care must be taken for each test mode due to the fact that the test mode value is already set when the reset occurs and the JTAG interface is re-blocked.

According to various disclosed embodiments, there is provided: An integrated circuit comprising: multiple interface modules, which are configured so that only one of said interface modules can be active during product mode operation of the chip; and test control logic, which allows multiple ones of said interface modules to be powered up during a special test mode, which is not available during product mode operation of the chip.

According to various disclosed embodiments, there is provided: An integrated circuit comprising: core circuitry with a desired functionality; and multiple interface modules, which are electrically connected so that each can provide interface between said core circuitry and an external interface, and only one of said interface modules can be active during product mode operation of the chip; and test control logic, which allows multiple ones of said interface modules to be powered up during a special test mode, which is not activated during product mode operation of the chip.

According to various disclosed embodiments, there is provided: A nonvolatile memory control integrated circuit comprising: a dedicated interface to nonvolatile memory, and memory control circuitry which provides controlled secure access to the memory; and multiple host interface modules, which are configured so that each can provide interface between said control circuitry and an external interface, and only one of said interface modules can be active during normal operation of the chip; and test control logic, which allows multiple ones of said interface modules to be powered up during a special test mode, which is not activated during normal operation of the chip; whereby said controller can operate a complete memory unit in a selected one of multiple interface modes.

According to various disclosed embodiments, there is provided: A method for manufacturing an integrated circuit, comprising the actions of: a) manufacturing a chip which, when configured for use, can operate in only one of multiple mutually exclusive modes; wherein said mutually exclusive modes are respectively operated by mutually-exclusive power islands which, when the chip is configured for use, cannot all be powered up simultaneously; b) testing said chip, using a sequence which tests all of said modes, while powering up said mutually-exclusive power islands simultaneously; and c) after said step b, configuring said chip for use.

According to various disclosed embodiments, there is provided: A method of testing an integrated circuit, comprising the steps of: integrating multiple interface modules which have mutually exclusive external connection requirements; operating test control logic to power up multiple ones of the interface modules during a special test mode, which is not activated during normal operation of the chip; testing all said interface modules contemporaneously during said test mode; and accordingly designating the integrated circuit as failed or not.

According to various disclosed embodiments, there is provided: a multi-interface integrated circuit in which, during the chip's lifetime in use, only one interface is active at a time. However, special test logic powers up all of the on-chip interface modules at once, so that a complete test cycle can be performed. All of the interfaces are exercised in one test program. Since some pads are inactive in some interface modes, mask bits are used to select which pads are monitored during which test cycles.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

For example, the number of different interface modules can be more or fewer than three.

For another example, the presently preferred embodiment uses static selection of the interface modules, but optionally this selection can be made quasi-static, i.e. changeable when a gross mode switch occurs.

For another example, the number of tests which are run during the test mode can be more or fewer than the number run in the preferred embodiment.

For another example, it is also possible to permit multiple test modes, including a universal test mode as described in one of the embodiments above, as well as a more limited test mode which does not require power-on of all optional modules.

Reference is also made to the following commonly owned and copending U.S. patent applications, each and every one of which is hereby incorporated by reference in its entirety: 60/934,936 filed Dec. 31, 2006; 60/921,507 filed Dec. 31, 2006; 60/934,918 filed Dec. 31, 2006; 60/934,917 filed Dec. 31, 2006; 60/999,760 filed Dec. 31, 2006; 60/934,923 filed Dec. 31, 2006; 60/934,937 filed Jan. 1, 2007; 60/921,508 filed Jan. 1, 2007; 11/618,849 filed Dec. 31, 2006; 11/618,852 filed Dec. 31, 2006; 11/618,865 filed Dec. 31, 2006; 11/618,867 filed Dec. 31, 2006; 11/649,325 filed Dec. 31, 2006; 11/649,326 filed Dec. 31, 2006; 11/965,943 filed Dec. 28, 2007 (SDD-1093, "Systems and Circuits with Multirange and Localized Detection of Valid Power") and; Ser. No. 11/966,012 filed Dec. 28, 2007 (SDD-1100, "Optionally Bonding Either Two Sides or More Sides of Integrated Circuits"). None of these applications are necessarily related to the present application, but these help to show features which were designed into the same system as the ideas described above, and/or which combine synergistically with those ideas.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. An integrated circuit comprising:
   core circuitry with a desired functionality; and
   multiple interface modules, which are electrically connected so that each can provide interface between said core circuitry and an external interface, and
   only one of said interface modules can be active during product mode operation of the chip; and
   test control logic, which allows multiple ones of said interface modules to be powered up during a special test mode, which is not activated during product mode operation of the chip.

2. The integrated circuit of claim 1, wherein different ones of said interface modules operate at different internal voltages.

3. The integrated circuit of claim 1, wherein different ones of said interface modules interface to different external voltages.

4. The integrated circuit of claim 1, comprising at least three said interface modules.

5. The integrated circuit of claim 1, comprising no more than three said interface modules.

6. The integrated circuit of claim 1, wherein selection of said interface modules is determined by external voltages seen at pads.

7. The integrated circuit of claim 1, wherein said multiple interface modules each reside on an independent respective one of a plurality of interface-module power islands, no more than one of which is powered up at any instant during normal operation; and wherein multiple other ones of said power islands are powered on and powered off at various times during normal operation.

8. The integrated circuit of claim 1, wherein all but one interface module is powered off and isolated during normal operation.

9. The integrated circuit of claim 1, wherein all but one interface module is totally powered off during normal operation.

10. The integrated circuit of claim 1, wherein, in use, said core logic which communicates off-chip only through said interface modules.

11. The integrated circuit of claim 1, wherein, in use, said core logic which, in use in the field, communicates with external pins only through said interface modules.

* * * * *